(12) United States Patent
Ballandras et al.

(10) Patent No.: US 12,542,532 B2
(45) Date of Patent: Feb. 3, 2026

(54) TRANSDUCER STRUCTURE FOR SINGLE-PORT RESONATOR

(71) Applicant: Soitec, Bernin (FR)

(72) Inventors: Sylvain Ballandras, Besançon (FR); Emilie Courjon, Franois (FR); Florent Bernard, Besançon (FR)

(73) Assignee: Soitec, Bernin (FR)

( * ) Notice: Subject to any disclaimer, the term of this patent is extended or adjusted under 35 U.S.C. 154(b) by 811 days.

(21) Appl. No.: 17/757,800

(22) PCT Filed: Dec. 28, 2020

(86) PCT No.: PCT/EP2020/087927
§ 371 (c)(1),
(2) Date: Jun. 21, 2022

(87) PCT Pub. No.: WO2021/136756
PCT Pub. Date: Jul. 8, 2021

(65) Prior Publication Data
US 2022/0360249 A1   Nov. 10, 2022

(30) Foreign Application Priority Data
Dec. 30, 2019 (FR) ...................................... 1915741

(51) Int. Cl.
*H03H 9/25* (2006.01)
*H03H 3/08* (2006.01)
(Continued)

(52) U.S. Cl.
CPC ................ *H03H 9/25* (2013.01); *H03H 3/08* (2013.01); *H03H 9/02818* (2013.01); *H03H 9/02992* (2013.01); *H03H 9/14541* (2013.01)

(58) Field of Classification Search
CPC ........ H03H 9/02992; H03H 9/25; H03H 9/64; H03H 9/14541; H03H 3/08; H04R 17/00
See application file for complete search history.

(56) References Cited

U.S. PATENT DOCUMENTS

| 2005/0200234 A1* | 9/2005 | Sobu ...................... H03H 9/725 310/313 R |
| 2012/0161577 A1 | 6/2012 | Abbott et al. |

(Continued)

FOREIGN PATENT DOCUMENTS

| EP | 2091146 B1 | 7/2015 |
| JP | 51-150251 | 12/1976 |

(Continued)

OTHER PUBLICATIONS

Chung et al., Proton-Exchanged 36 degrees Y-X LiTaO3 Waveguides for Surface Acoustic Wave, IEEE Trans Ultrason Ferroelectr Freq Control, (Feb. 2006), pp. 502-505.

(Continued)

*Primary Examiner* — Bryan M Lettman
(74) *Attorney, Agent, or Firm* — TraskBritt (57) ABSTRACT

A transducer structure with means for transverse mode suppression comprises a piezoelectric substrate, and a pair of inter-digitated comb electrodes on the piezoelectric substrate. The first comb electrode has a first bus bar and a plurality of electrode fingers alternating with shorter dummy fingers, both extending from the first bus bar. The second comb electrode has a second bus bar and a plurality of electrode fingers extending from the second bus bar. The dummy fingers of the first bus bar face the fingers of the second bus bar and are separated from the fingers by first gaps. A transverse mode suppression layer is disposed partially underneath the first gap. The phase velocity of a guided wave is smaller in the region of the transverse mode suppression layer compared to the phase velocity of the guided wave in the central region underneath the alternating fingers of the first and second electrodes.

20 Claims, 8 Drawing Sheets

(51) Int. Cl.
*H03H 9/02* (2006.01)
*H03H 9/145* (2006.01)

(56) References Cited

U.S. PATENT DOCUMENTS

| | | |
|---|---|---|
| 2013/0249647 A1 | 9/2013 | Nakanishi et al. |
| 2014/0001919 A1 | 1/2014 | Komatsu et al. |
| 2015/0123746 A1 | 5/2015 | Nakamura et al. |
| 2015/0180451 A1 | 6/2015 | Nakazawa et al. |
| 2015/0280689 A1* | 10/2015 | Nakamura .......... H03H 9/02834 333/195 |
| 2016/0126928 A1 | 5/2016 | Ruile et al. |
| 2017/0155373 A1* | 6/2017 | Ruby ................ H03H 9/02574 |
| 2017/0317516 A1 | 11/2017 | Stern |
| 2017/0366165 A1* | 12/2017 | Shih ........................ H03H 9/64 |
| 2018/0062612 A1* | 3/2018 | Daimon ................... H03H 9/56 |
| 2018/0097508 A1 | 4/2018 | Iwamoto et al. |
| 2018/0375491 A1 | 12/2018 | Iwaki et al. |
| 2019/0058454 A1 | 2/2019 | Nakamura |
| 2019/0123713 A1* | 4/2019 | Daimon ............... H03H 9/1457 |
| 2019/0334500 A1 | 10/2019 | Horikawa |
| 2019/0372553 A1* | 12/2019 | Myeong ............ H03H 9/02574 |

FOREIGN PATENT DOCUMENTS

| | | |
|---|---|---|
| JP | 2005-311786 A | 11/2005 |
| JP | 2015-188123 | 10/2015 |
| JP | 61-064310 | 7/2017 |
| JP | 2019-102896 | 6/2019 |
| JP | 2021-510906 A | 4/2021 |
| WO | 2019/197086 A1 | 7/2015 |
| WO | 2018/097016 A1 | 5/2018 |
| WO | 2019/172374 A1 | 9/2019 |
| WO | 2019/175315 A1 | 9/2019 |

OTHER PUBLICATIONS

International Search Report for International Application No. PCT/EP2020/087927 dated Apr. 14, 2022, 5 pages.

International Written Opinion for International Application No. PCT/EP2020/087927 dated Apr. 14, 2022, 11 pages.

Kakio et al., Suppression of Bulk Wave Radiation from Leaky Surface Acoustic Waves by Loading with Thin Dielectric Films, Journal of Applied Physics, vol. 87, No. 3, (Jan. 18, 2000), abstract only.

Korean Written Decision on Registration received for Korean Patent Application No. 10-2022-7026139, mailed on May 24, 2024, 5 pages With English Translations.

French Search Report and Opinion for Application No. 2310007 dated Feb. 19, 2024, 20 pages with machine translation.

Japanese Notice of Refusal for Application No. 2022-538955 dated Sep. 20, 2023, 24 pages with machine translation.

\* cited by examiner

TRANSDUCER STRUCTURE FOR SINGLE-PORT RESONATOR

CROSS-REFERENCE TO RELATED APPLICATIONS

This application is a national phase entry under 35 U.S.C. § 371 of International Patent Application PCT/EP2020/087927, filed Dec. 28, 2020, designating the United States of America and published as International Patent Publication WO 2021/136756 A1 on Jul. 8, 2021, which claims the benefit under Article 8 of the Patent Cooperation Treaty to French Patent Application Serial No. FR1915741, filed Dec. 30, 2019.

TECHNICAL FIELD

The present disclosure relates to a transducer structure with transverse mode suppression means, in particular, for a single-port resonator and a method for manufacturing such a transducer.

BACKGROUND

The present disclosure is in the field of surface acoustic wave (SAW) devices built on piezoelectric single crystals or on composite substrates using piezoelectric film, so-called POI for Piezo-On-Insulator. These composite wafers are used as waveguides for the excitation of true modes using inter-digitated transducers (IDT) for radio-frequency (RF) filter manufacturing. The transducer structure is a key part of so-called single-port resonators that are used as an impedance element of the mentioned filters. More precisely, so-called ladder filters are exploiting the resonators to achieve the filter function. Also single-port resonators as used for sensor applications and more precisely wireless sensing are affected by such effects, this often requiring means to suppress them, for instance, by aperture tapering (see, for instance, EP 2091146 B1), which is known to degrade the electromechanical coupling of the device. Single-port resonators comprise one transducer structure mounted in the center of the resonator with reflectors positioned on both sides of the transducer structure, while two port SAW resonators are composed of two transducer structures (input/output) mounted in the center with reflectors arranged on both outer sides of the device.

Other types of SAW devices may take advantage of embodiments of the present disclosure such as longitudinally-coupled resonator filters (LCRF) or double-mode-SAW (DMS) filters or double-port SAW resonators or delay lines used, for instance, in oscillator stabilization for frequency source applications or in any other application (gravimetric sensing for instance).

Single-port resonators built on POI are exhibiting spurious contributions that are due to lateral energy trapping, yielding so-called transverse modes that pollute the device's spectral signature. It has therefore been proposed to provide means to suppress these contributions to improve the spectral purity of the resonator response and to allow for specification-compliant filter manufacturing and more generally SAW device manufacturing.

A difficulty in the state of the art is to manufacture structures capable to suppress the transverse modes.

It has been proposed to reload the electrode edge with metal or dielectric overlays, like disclosed in U.S. Patent Application Publication No. US2012/0161577A1 or No. US2013/0249647A1.

In U.S. Patent Application Publication US2012/0161577A1, a metal is re-deposited on the top of the electrode edge, imposing a strong accuracy in pattern alignment, thus needing expensive processing tools and control.

In U.S. Patent Application Publication US2013/0249647A1, the whole inter-digitated transducer (IDT) structure is covered by a dielectric layer, which is thicker on the transducer edge than in the middle. In U.S. Patent Application Publication US2015/0123746A1, a dielectric film covers at least a part of the piezoelectric substrate and the IDT electrodes, more precisely covers a region in which the electrode fingers are interleaved with each other, the acoustic velocity being larger in the central part of the IDT finger than on the edge, to avoid the arising of the transverse modes. In most applications using a dielectric layer, the need for patterning the later using acids or reactive ion etching or ion milling leads to a degradation of the electrode quality when no etch stop solution is applied to prevent such effect or leads even to a degradation of the substrate surface if not properly protected.

Other approaches are based on the enlargement of the electrode dimensions, like described in U.S. Patent Application Publication No. US2018/0097508A1 or No. US2018/0375491A1. These structures yield difficulties in guaranteeing the isolation from one electrode to another.

However, in all the approaches cited above, for these transducer structures, the transverse modes, although reduced, are still possible.

BRIEF SUMMARY

The objective of the present disclosure is thus to provide a transducer structure for single-port resonators with suppressed transverse modes with a simpler manufacturing process compared to the state of the art devices while preserving the intrinsic quality of the device and of the substrate surface.

The object of the present disclosure is realized with a transducer structure with transverse mode suppression means, in particular, for a single-port resonator, comprising a piezoelectric substrate, at least a pair of inter-digitated comb electrodes formed on the piezoelectric substrate, in particular, a piezoelectric composite substrate comprising a piezoelectric layer over a base substrate, wherein the first comb electrode comprises a first bus bar and a plurality of alternating electrode fingers and shorter dummy electrode fingers, both extending from the bus bar, wherein the second comb electrode comprises a second bus bar and a plurality of electrode fingers extending from the second bus bar, the dummy electrodes of the first bus bar face the electrode fingers of the second bus bar and are separated from the electrode fingers of the second bus bar by first gaps, further comprising a transverse mode suppression layer provided partially underneath the first gap and chosen such that the phase velocity of a guided wave is smaller in the region of the transverse mode suppression layer compared to the phase velocity of the guided wave in the piezoelectric substrate in the central region underneath the alternating electrode fingers of the first and second comb electrode. The presence of the transverse mode suppression layer leads to a slowing down the wave velocity in the gap, which leads to the suppression or reduction of the unwanted transverse mode in the transducer structure. Thus, in the transducer structure according to the present disclosure, the contribution of the transverse modes can be reduced. From an acoustic point of view, the transducer structure according to the present disclosure enables to transfer energy from the IDT finger to the dummy finger without or with reduced reflection at the edge of the IDT finger.

In a variant of the embodiment, the transverse mode suppression layer can extend under each of the first gaps. The transverse mode suppression layer enables reduction of the wave velocity in the gap, which leads to the suppression or reduction of the unwanted transverse mode in the transducer structure. From an acoustic point of view, the transducer structure according to the present disclosure enables transfer of energy from the IDT finger to the dummy finger without or with reduced reflection at the edge of the IDT finger.

In a variant of the embodiment, the second comb electrode can comprise shorter dummy electrode fingers alternating with the electrode fingers, the dummy electrode fingers of the second bus bar face the electrode fingers of the first bus bar and are separated from the electrode fingers by second gaps, and further comprising a second transverse mode suppression layer extending at least partially underneath the second gaps and chosen such that the phase velocity of a guided wave is smaller in the region of the second transverse mode suppression layer compared to the phase velocity of the guided wave in the central region underneath the alternating electrodes fingers of the first and second comb electrodes, between the first and second transverse mode suppression layer. The transverse mode suppression layer enables to slow down the wave velocity in the gap, which leads to the suppression or reduction of the unwanted transverse mode in the transducer structure. Thus, in the transducer structure according to the present disclosure, the contribution of the transverse modes can be further reduced. From an acoustic point of view, the transducer structure according to the present disclosure enables transfer of energy from the IDT finger to the dummy finger without or with reduced reflection at the edge of the IDT finger.

In a variant of the embodiment, the second transverse mode suppression layer can extend underneath all the second gaps. The transverse mode suppression layer enables reduction of the wave velocity in the gap, which leads to the suppression or reduction of the unwanted transverse mode in the transducer structure. From an acoustic point of view, the transducer structure according to the present disclosure enables transfer of energy from the IDT finger to the dummy finger without or with reduced reflection at the edge of the IDT finger.

In a variant of the embodiment, the first transverse mode suppression layer can extend at least partially up to the first bus bar and/or the second transverse mode suppression layer can extend at least partially up to the second bus bar.

In a variant of the embodiment, the first transverse mode suppression layer can further extend at least partially or at least totally under the first bus bar and/or the second transverse mode suppression layer can further extend at least partially or at least totally under the second bus bar.

In a variant of the embodiment, the first and/or second transverse mode suppression layer can comprise a different doping dose compared to the rest of the piezoelectric substrate in the central region underneath the inter-digitated comb electrodes for modulating the phase velocity, in particular, the different doping dose is a Ti dose. The doping corresponds here to an intentional introduction of impurities in the piezoelectric substrate. The difference in doping of the at least transverse mode suppression layer results in a reduction of the phase velocity of the mode near the gap separating the IDT electrodes from the dummy electrodes without need for any lateral patterning.

In a variant of the embodiment, the first and/or second transverse mode suppression layer of the piezoelectric layer can comprise a passivation layer, in particular, a dielectric passivation layer, more in particular, a $SiO_2$ layer.

In a variant of the embodiment, the passivation layer can be at least partially embedded in the piezoelectric substrate.

In a variant of the embodiment, the first transverse mode suppression layer and the second transverse mode suppression layer can be mirror symmetrical with respect to the center line of the inter-digitated comb electrodes.

In a variant of the embodiment, the first transverse mode suppression layer and the second transverse mode suppression layer can have different shapes.

In a variant of the embodiment, the piezoelectric substrate can be a piezoelectric composite substrate comprising a piezoelectric layer over a base substrate. Such composite substrate not only allows a configuration making it possible to obtain a variation of the frequency with the optimized temperature, but also opens up the possibility to exploit guided waves. The modes of the structure can present different type of polarization, in particular, elliptical polarization waves but also and mostly shear waves or pure or almost pure longitudinal compression waves, whose electromechanical coupling is largely superior to 7% and enables the realization of filters with bandwidth as requested for modern filter application, namely above 5%.

In a variant of the embodiment, the piezoelectric layer can have a thickness less than the value of the wavelength $\lambda$ of the acoustic transducer, in particular, inferior to 0.7 times the value of the wavelength $\lambda$, more in particular, inferior to 0.5 times the value of the wavelength $\lambda$. For a chosen working frequency, the thickness of the piezoelectric layer is optimized in order to optimize the guided feature of the wave to be used. For a given thickness of the piezoelectric layer allowing a guided feature of the wave mainly at the surface, the present disclosure is particularly interesting as the parasitic transverse modes are more pronounced due to the guiding of the wave and to the possibility of in phase reflection of such type of waves at the sides of the electrodes.

In a variant of the embodiment, the thickness of the suppression layer can be superior to $1/20$ of the wavelength $\lambda$, in particular, is superior to $1/10$ of the wavelength $\lambda$, while being inferior to the thickness of the piezoelectric layer. The optimal thickness of the suppression layer found is assessed in relation to the wavelength $\lambda$.

In a variant of the embodiment, the thickness of the suppression layer can correspond at the maximum to $1/2$ of the value of the wavelength $\lambda$, in particular, at the maximum to $1/3$ of the value of the wavelength $\lambda$. An increase of the thickness over which the suppression layer extends can be detrimental to the suppression effect wanted, and can result in energy leaks by diffraction of the energy of the principal mode, reducing its quality factor.

In a variant of the embodiment, the thickness of the suppression layer can be of the order of the thickness of the electrodes, in particular, $\pm 50\%$ of the nominal value, more in particular, Al_Cu electrodes having between 0.5 and 2% Cu doping with a thickness between 5 and 20% of the value of the wavelength $\lambda$. In this particular case, at least 90% from the transverse modes existing without a suppression layer are suppressed.

In a variant of the present disclosure, the guided wave can be an elliptical polarization waves, a shear waves, pure or almost pure longitudinal compression waves, with an electromechanical coupling superior to 7%. The modes of the transducer structure can present different type of polarization and enables the realization of filters with bandwidth as requested for modern filter application, namely above 5%.

The object of the present disclosure is also realized with a method for manufacturing a transducer structure comprising the steps of a) providing a piezoelectric substrate; in particular, a piezoelectric composite substrate comprising a piezoelectric layer over a base substrate, b) forming at least a pair of inter-digitated comb electrodes over the piezoelectric substrate, wherein the first comb electrode comprises a first bus bar and a plurality of alternating electrode fingers and shorter dummy electrode fingers, both extending from the first bus bar, the second comb electrode comprises a second bus bar and a plurality of alternating electrode fingers extending from the second bus bar, the dummy electrodes of the first bus bar face the electrode fingers of the second bus bar and are separated from the electrode fingers of the second bus bar by first gaps, a step c) prior to step b) of providing a transverse mode suppression layer such that after step c) the transverse mode suppression layer is partially underneath the first gap, wherein the transverse mode suppression layer is chosen such that the phase velocity of a guided wave is smaller in the transverse mode suppression layer compared to the phase velocity of the guided wave in the piezoelectric substrate in the central region underneath the alternating electrode fingers of the first and second electrodes. Such method enables to form the transverse mode suppression layer before the inter-digitated electrodes are formed. Thus, with this method, the inter-digitated electrodes cannot be damaged by the forming step of the suppression layer and as a result, the intrinsic quality of the device and of the substrate surface is preserved. This method enables to keep the usual SAW front-end manufacturing process unchanged. To the contrary of the state of the art devices, where the inter-digitated electrodes are formed on the piezoelectric substrate and subsequently a transverse mode suppression layer is formed over the inter-digitated electrodes. Furthermore, the method according to the present disclosure results in a simpler manufacturing process compared to the state of the art devices.

In a variant of the present disclosure, the step c) of providing a transverse mode suppression layer can comprise providing a first transverse mode suppression layer and a second transverse mode suppression layer extending at least partially underneath the second gaps and chosen such that the phase velocity of a guided wave is smaller in the region of the second transverse mode suppression layer compared to the phase velocity of the guided wave in the central region underneath the alternating electrodes fingers of the first and second comb electrodes, between the first and second transverse mode suppression layer, wherein the second comb electrode further comprises shorter dummy electrode fingers alternating with the electrode fingers, and the dummy electrode fingers of the second bus bar face the electrode fingers of the first bus bar and are separated from the electrode fingers of the first bus bar by second gaps. Such method enables to form the transverse mode suppression layers before the inter-digitated electrodes are formed. Thus, with this method, the inter-digitated electrodes cannot be damaged by the forming step of the suppression layer and as a result, the intrinsic quality of the device and of the substrate surface is preserved. This method enables to keep the usual SAW front-end manufacturing process unchanged. To the contrary of the state of the art devices, where the inter-digitated electrodes are formed on the piezoelectric substrate and subsequently a transverse mode suppression layer is formed over the inter-digitated electrodes. Furthermore, the method according to the present disclosure results in a simpler manufacturing process compared to the state of the art devices.

In a variant of the present disclosure, the step of providing a transverse mode suppression layer can comprise a step of modifying the doping dose of the piezoelectric substrate, in particular, with an implantation step or diffusion of atomic species step and/or a proton exchange technique. Again, the doping corresponds here to an intentional introduction of impurities in the piezoelectric substrate. A simple technique can be used to form the transverse mode suppression layer compared to the techniques used in the manufacturing process of the state of the art devices.

In a variant of the present disclosure, the step of providing a transverse mode suppression layer can comprise providing a passivation layer, in particular, a dielectric passivation layer, more in particular, a $SiO_2$ layer. A material layer deposition technique can be used to form the transverse mode suppression layer, which is a simpler technique compared to the techniques used in the manufacturing process of the state of the art devices. In a variant of the present disclosure, the step of providing a transverse mode suppression layer can comprise a step of at least partially embedding the passivation layer in the piezoelectric substrate.

In a variant of the present disclosure, the passivation layer can be patterned by a lift off process, so that the sides of the passivation layer are inclined in such a way that the deposited comb electrodes cover these sides without rupture, providing a regular and continuous reduction of the phase velocity in the corresponding region. This thus, even reduces the possibilities for the transverse mode to develop as the later needs preferably a sharp velocity variation at the edge of the electrodes that act as a wave reflector. In that case, no etching is required, thus keeping the substrate in good conditions. In the case the substrate must be preserved from organic contamination, a so-called wet-etch process based on isotropic etching of the silicon dioxide layer can be implemented, also yielding smooth edges of the patterned passivation layer. The $SiO_2$ is therefore deposited homogeneously on top of the wafer as a first step and then a photo-resist in-situ etching mask is patterned on top of the layer, allowing for locally etching the $SiO_2$ layer. Alignment marks, however, must be deposited in both cases to prepare the surface according to the usual technology processes in that purpose.

The object of the present disclosure is also realized with a SAW device, in particular, a single-port resonator, comprising at least a transducer structure as described previously. Such a SAW device can be fabricated with a simpler manufacturing process compared to the state of the art while presenting a reduced contribution from transverse modes, which results in an improved spectral purity of the resonator response.

BRIEF DESCRIPTION OF THE DRAWINGS

The present disclosure may be understood by reference to the following description taken in conjunction with the accompanying figures, in which reference numerals identify features of the present disclosure.

DETAILED DESCRIPTION

Embodiments of the present disclosure will now be described in more detail using advantageous embodiments in an exemplary manner and with reference to the drawings. The described embodiments are merely possible configurations and it should be kept in mind that the individual characteristics as described above can be provided independently of one another or can be omitted altogether during the implementation of the present disclosure.

Figure 1A:
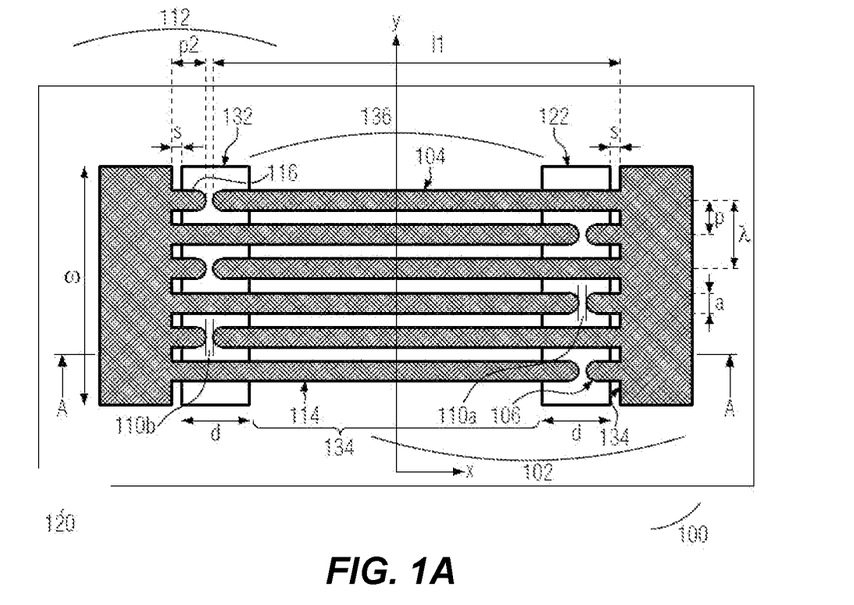
FIG. 1A represents a top view of a transducer structure according to a first embodiment of the present disclosure.

FIG. 1A represents a top view of a transducer structure according to a first embodiment of the present disclosure.

The transducer structure 100 comprises a pair of inter-digitated comb electrodes 102 and 112 provided over a piezoelectric substrate 120. The piezoelectric substrate 120 can be a bulk piezoelectric substrate or a composite substrate with a piezoelectric layer over a base substrate, which will be explained further down with respect to FIG. 1B.

The first inter-digitated comb electrode 102 comprises a plurality of electrode fingers 104 and a plurality of dummy electrode fingers 106 and extending from a first bus bar 108. Likewise, the second inter-digitated comb electrode 112 comprises a plurality of electrode fingers 114 and a plurality of dummy electrode fingers 116 extending from a second bus bar 118. The dummy electrode fingers 106 of the first bus bar 108 are facing the electrode fingers 114 of the second bus bar 118 and are separated from the electrode fingers 114 of the second bus bar 118 by first gaps 110a. The dummy electrode fingers 116 of the second bus bar 118 are facing the electrode fingers 104 of the first bus bar 108 and are separated from the electrode fingers 104 of the first bus bar 108 by second gaps 110b. Here the first and second gaps 110a and 110b are the same.

According to a variant of the present disclosure, the second comb electrode 112 has no dummy electrode fingers 116 extending from the second bus bar 118, only a plurality of electrode fingers 116. In this case, the second gaps 110b are defined by the distance between the second bus bar 118 and the facing electrodes 104 of the first comb electrode 102.

According to a variant of the present disclosure, not all the electrode fingers 104, 114 of the first 108 and/or second 118 bus bar have a dummy electrode finger 106, 116 of the corresponding bus bar 108, 118 facing them and vice versa.

In a variant, the first and second gaps 110a, 110b can be different throughout the transducer structure 100, in particular, the first and second gaps 110a, 110b can be randomly different in length or position within the transducer structure 100.

The inter-digitated comb electrodes 102, 112 are formed of any suitable conductive metal, for example, aluminum or aluminum alloys such as Al—Cu, Al—Ti or Al—Si.

The two inter-digitated comb electrodes 102, 112 are connected to opposite potentials +V/−V. The transducer structure 100 has an electrode pitch p, being defined by the Bragg condition and thus p is equal to $\lambda/2$, $\lambda$ being the operating wavelength of the transducer structure 100. The pitch p represents the distance between the centers of adjacent electrode fingers of the inter-digitated electrodes. Thus, in this embodiment, p corresponds to the distance between the center of the electrode finger 104 of the first comb electrode 102 and the center of the adjacent electrode finger 114 of the electrode 112. The transducer structure 100 is synchronous, i.e., the inter-digitated electrode fingers 104, 114 exhibit the same width, period and shape.

The electrode fingers 104, 114 and the dummy electrode fingers 106, 116 have a width a. According to the art, the metallic aspect ratio is defined by a/p.

The electrode fingers 104, 114 of the inter-digitated electrodes 102, 112, respectively, are the same, with the same width a and the same length $l_1$. In a variant, the inter-digitated electrodes could have different electrode fingers 102, 112.

In the same way, the dummy electrode fingers 106, 116 of the inter-digitated electrodes 102, 112 are the same, with the same width a and the same length $l_1$. In a variant, the inter-digitated electrodes 102, 112 could have different dummy electrode fingers 106, 116.

In FIG. 1A, the inter-digitated electrodes 102, 112 are the same, namely they have the same electrode fingers, the same pitch p and the same first and second gaps 110a, 110b. In a variant, they could be different, with different pitch p, different gaps and different electrode fingers 102, 112 and dummy electrode fingers 106, 116.

According to the present disclosure, two transverse mode suppression layers 122 and 132 are provided between the substrate 120 and the inter-digitated comb electrodes 102, 112. The first transverse mode suppression layer 122 is positioned underneath the first gaps 110a and the second transvers mode suppression layer 132 is positioned underneath the second gaps 110b. Their physical properties are chosen such that the phase velocity of the guided wave of the transducer structure is smaller in the region of the transverse mode suppression layers 122, 132 compared to the phase velocity of the guided wave of the transducer structure in the piezoelectric substrate 120 in the remaining area 134 being the central region 136 underneath the alternating electrode fingers of the first and second electrodes. The guided wave can be any guided wave or true mode of the surface, comprising Rayleigh-like waves and shear waves and pure or quasi pure shear or longitudinal waves.

In a variant of the embodiment, only one transverse mode suppression layer is present in the transducer structure.

In this embodiment, the first and second transverse mode suppression layers 122 and 132 are rectangular and have the same dimensions and shape. The regions 122 and 132 extend along the direction y, below all the electrode fingers 104, 114 and all the dummy electrode fingers 106, 116 of the transducer structure 100, thus, along the whole length w of the transducer structure 100. They are symmetrical with respect to the central line y of the inter-digitated electrodes 102, 112 of the transducer structure 100.

The first and second transverse mode suppression layers 122 and 132 extend along the direction x, which is the direction of propagation of an unwanted transverse acoustic wave in the transducer structure 100, over a length d. In FIG. 1A, the transverse mode suppression layer 122 extends over the first gap 110a and over a portion of the dummy electrode fingers 106 and a portion of the electrode fingers 104. Likewise, the transverse mode suppression layer 132 extends over the second gap 110b and over a portion of the dummy electrode fingers 116 and a portion of the electrode fingers 114.

In FIG. 1A, the first and second transverse mode suppression layers 122 and 132 are located at the same distance s from the bus bar 108, 118 in the X direction. In a variant, they can have a different distance to the bus bars.

Figure 1B:
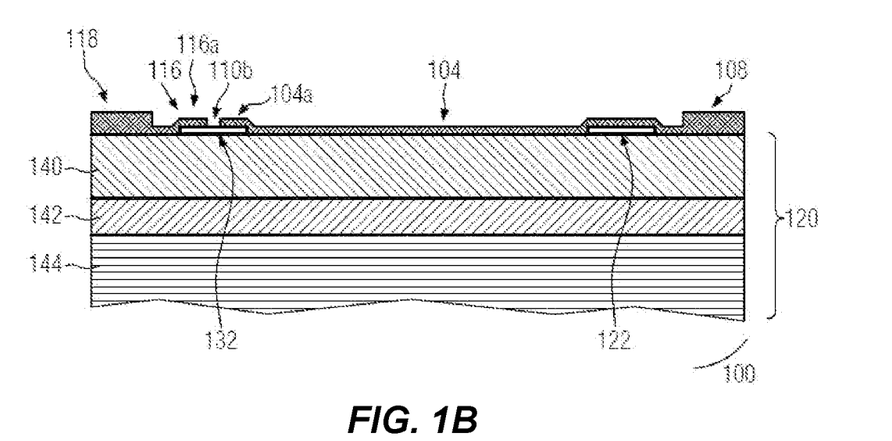
FIG. 1B represents a side view of the transducer structure according to the first embodiment of the present disclosure.

In FIG. 1B, a cut side view a long line AA of FIG. 1A of a transducer structure 100 according to the first embodiment of the present disclosure is shown.

In particular embodiments, the support substrate 120 is a composite substrate comprising a piezoelectric layer 120 provided on top of a base substrate 144. A thin dielectric layer 142 is deposited between the piezoelectric layer 140 and the base substrate 144. In a variant, the piezoelectric layer 140 can be directly deposited on top of the base substrate 144.

Such composite substrate not only allows a configuration making it possible to obtain a variation of the frequency with the optimized temperature, but also opens up the possibility to exploit guided waves. The modes of the structure can present different types of polarization, in particular, elliptical polarization waves but also and mostly shear waves or pure or almost pure longitudinal compression waves, whose electromechanical coupling is largely superior to 7% and enables the realization of filters with bandwidth as requested for modern filter application, namely above 5%.

In an advantageous manner, the thickness (referred to as d_piezo) of the piezoelectric layer 140 is of the order of the wavelength $\lambda$ or smaller, i.e., smaller than 0.7 times the value of the wavelength $\lambda$ or even smaller than 0.5 times the value of the wavelength $\lambda$, the wavelength $\lambda$ being the operating wavelength of the transducer structure 100.

In practical cases, the piezoelectric layer has a thickness smaller than 1 µm, in particular, smaller than 700 nm. For a chosen working frequency, the thickness of the piezoelectric layer is optimized in order to optimize the guided feature of the wave to be used. For a given thickness of the piezoelectric layer allowing a guided feature of the wave mainly at the surface, the present disclosure is particularly interesting as the parasitic transverse modes are more pronounced due to the guiding of the wave and to the possibility of in phase reflection of such type of waves at the sides of the electrodes. In this embodiment, the first and second transverse mode suppression layers 122 and 132 are a passivation layer deposited onto the piezoelectric layer 140, before the inter-digitated electrodes 102, 112 have been deposited onto the substrate 120, and thus onto the piezoelectric layer 140. The passivation layer is directly in contact with the piezoelectric layer 140.

The passivation layer is a dielectric layer, e.g., a $SiO_2$ or a $Ta_2O_5$ or $HfO_2$ layer.

The transverse mode suppression layer 122, also referred to as the first transverse mode suppression layer, located on the right side of the FIG. 1B is fully covered by the electrode finger 104, which is connected to its bus bar 108.

The second transverse mode suppression layer 132 located on the left side of the FIG. 1B extends underneath the extremity 116a of dummy electrode finger 116, the dummy electrode finger 116 being connected to its bus bar 118, the second gap 110b and the extremity 104a of the electrode finger 104, which is connected to the bus bar 108 at the connection 134.

In a variant of the present disclosure, the passivation layers have inclined sides or wall edges, so that when the comb electrodes cover the passivation layers fully, no rupture of the deposited comb electrodes takes place at the wall edge of the passivation layer, ensuring a regular and continuous electrode covering of the passivation layer.

In a variant, instead of using an additional passivation layer, the first and second transverse mode suppression layers 122, 132 can be formed within the piezoelectric layer 140, e.g., by having a different doping dose compared to the central region 136 of the piezoelectric layer 140 and the space between the transverse mode suppression layers 122, 132 and the bus bars having a width s. The doping corresponds here to an intentional introduction of impurities in the piezoelectric substrate. The difference in doping of the at least transverse mode suppression layer results in a reduction of the phase velocity of the mode near the gap separating the IDT electrodes from the dummy electrodes without need for any lateral patterning.

The thickness of the suppression layer(s) is at least 1/20 of the value of the wavelength $\lambda$, in particular, at least 1/10 of the value of the wavelength $\lambda$.

The suppression layer(s) to be implemented extends advantageously up to a particular depth (d_supp) in order to optimize the suppression of the transverse modes. An increase of the thickness over which the suppression layer extends can be detrimental to the suppression effect wanted, and can result in energy leaks by diffraction of the energy of the principal mode, reducing its quality factor. It is therefore advantageous, for certain embodiments, to limit the thickness of the suppression layer to at the maximum to 1/2 of the value of the wavelength $\lambda$, in particular, at the maximum to 1/3 of the value of the wavelength $\lambda$. The optimal thickness of the suppression layer found is assessed in relation to the wavelength $\lambda$ and defines the depth over which the piezoelectric layer is modified at the level of the suppression layers compared to its initial thickness.

As such, windows of optimal thickness are obtained as follows:

The thickness d_supp of the suppression layer is between 1/20 $\lambda$<1/10 $\lambda$<d_supp<1/3 $\lambda$<1/2 $\lambda$, while respecting d_supp<d_piezo<0.7 $\lambda$<1 $\lambda$.

A practical case with a wavelength $\lambda$ around 4 µm gives the following relationship: 200 nm<400 nm<d_supp<1.3 µm<2 µm, while d_supp<d_piezo<2.8 µm<4 µm. Another practical case with a wavelength around 1 µm would give the following relationship: 50 nm<100 nm<d_supp<300 nm<500 nm, while d_supp<d_piezo<700 nm<1 µm.

The suppression of transverse modes as proposed by the present disclosure is also influenced by the thickness of the comb electrodes. A particularly interesting configuration involves choosing the thickness of the electrodes, in particular, Al_Cu electrodes having between 0.5 and 2% Cu doping, between 5 and 20% of the value of the wavelength A. The thickness of the suppression layer(s) proposed in the present disclosure is then advantageously chosen with the same order of magnitude as the thickness of the comb electrode, in particular, at ±50% of the nominal value. In this thickness window, at least 90% from the transverse modes existing without a suppression layer are suppressed by the suppression layer.

The transducer structure 100 according to the first embodiment functions in the following way. The transducer structure according to the present disclosure is used to excite and detect shear waves. The shear displacement direction is alternated from one electrode to another when the transducer is excited by a +V/−V electrical polarization structure, as the device is operating at the Bragg conditions.

The presence of the first and second transverse mode suppression layers 122, 132 generate locations where the SAW propagation is modified, in such a way that a guided wave propagating into the region with wave suppression layers 122, 132 is exhibiting a phase velocity smaller than a guided wave propagating in the central region 136 of the substrate 120, which is without modification. The first and second transverse mode suppression layers 122, 132 change the velocity of the mode near the first and second gaps 110a and 110b between the active electrode finger 104 and its associated dummy electrode finger 116. Slowing down the wave velocity in the gap 110a and 110b leads to the suppression or reduction of the unwanted transverse mode.

Thus, in the transducer structure 100 according to the present disclosure, the contribution of the transverse modes can be reduced. At the same time, the manufacturing process is simplified compared to the state of the art transducer structures.

According to the present disclosure, although the local modification of the substrate 120 in or near the first and second gaps 110a, 110b requires an additional manufacturing step, the usual SAW front-end manufacturing process remains unchanged, simplifying the fabrication of transverse-mode-free devices. Furthermore, compared to other solutions needing precise alignment between subsequent layers, here a rough mask alignment is sufficient to realize the device fabrication.

As will be shown below, variants of the embodiment will show various shapes and position of the first and second transverse mode suppression layers 122 and 132 with respect to the transducer structure 100.

Reference numerals already used in the description of the first embodiment will not be repeated again, but reference is made to their description.

Figure 2A:
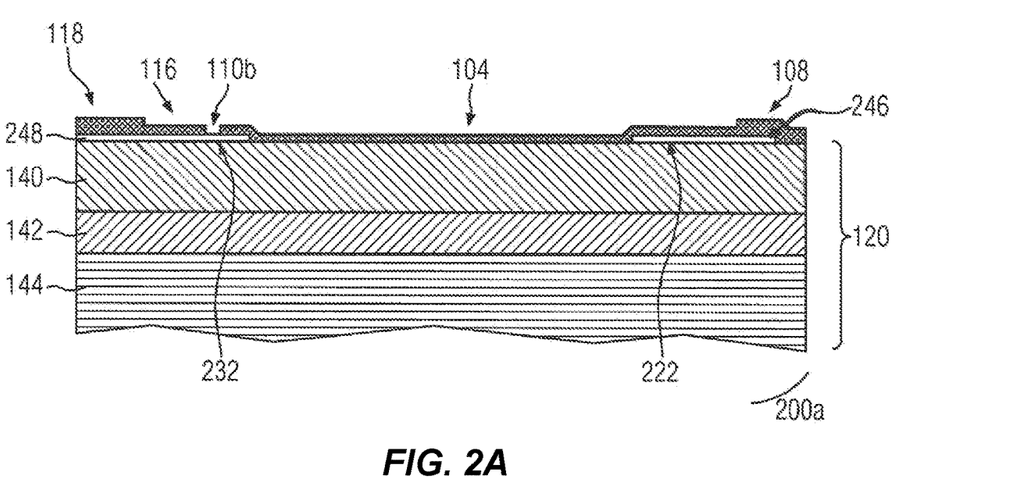
FIG. 2A represents a side view of a transducer structure according to a variant of the first embodiment of the present disclosure.

FIG. 2A represents a side view of a transducer structure 200a according to a first variant of the present disclosure.

Compared to the first embodiment, the passivation layer 246, 248 forming the first and second transverse mode suppression layers 122, 132 extend under the bus bars 108 and 118. The passivation layer 248 extends fully under the bus bar 118 while the other passivation layer 246 only extends partially under the bus bar 108. In this variant, the first and second transverse mode suppression layers 122 and 132 are not symmetrical.

In another variant, the first and second transverse mode suppression layers 122 and 132 can be embedded completely or partially into the piezoelectric layer 140.

Figure 2B:
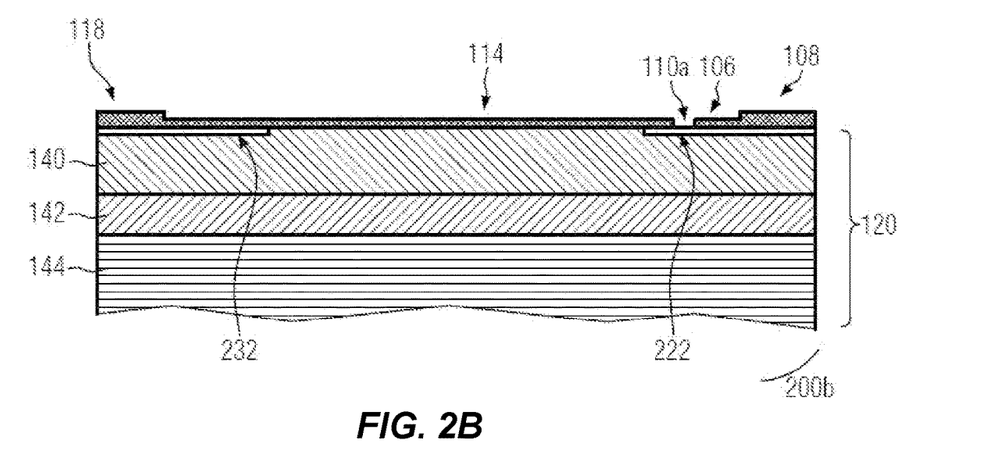
FIG. 2B represents a side view of a transducer structure according to another variant of the first embodiment of the present disclosure.

FIG. 2B represents a side view of a transducer structure 200b according to a second variant of the present disclosure.

Like mentioned in the description of the first embodiment, the first and second transverse mode suppression layers 222 and 232 of the piezoelectric layer 140 in this variant are locally modified structural piezoelectric layer 140. For example, the structural modification of the piezoelectric layer 140 corresponds to a different doping dose in the transverse mode suppression layer 222, 232 compared to the rest of the piezoelectric layer 140.

Figure 2C:
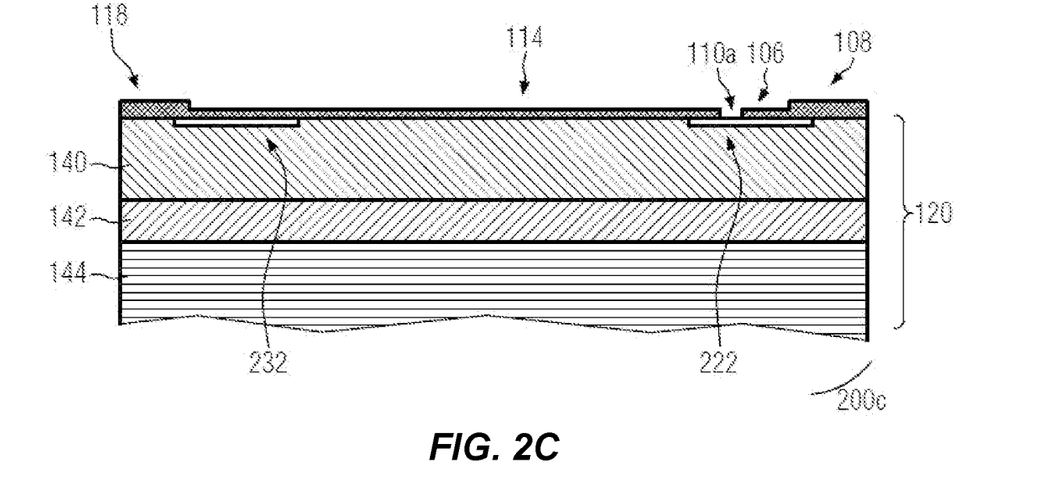
FIG. 2C represents a side view of a transducer structure according to another variant of the first embodiment of the present disclosure.

FIG. 2C represents a third variant of the transducer structure 200c of the first embodiment.

Compared to the variant of the second variant, the first and second transverse mode suppression layers 222 and 232 only extend partially under the bus bars 108, 118. The first and second transverse mode suppression layers 222 and 232 are symmetrical.

Figure 2D:
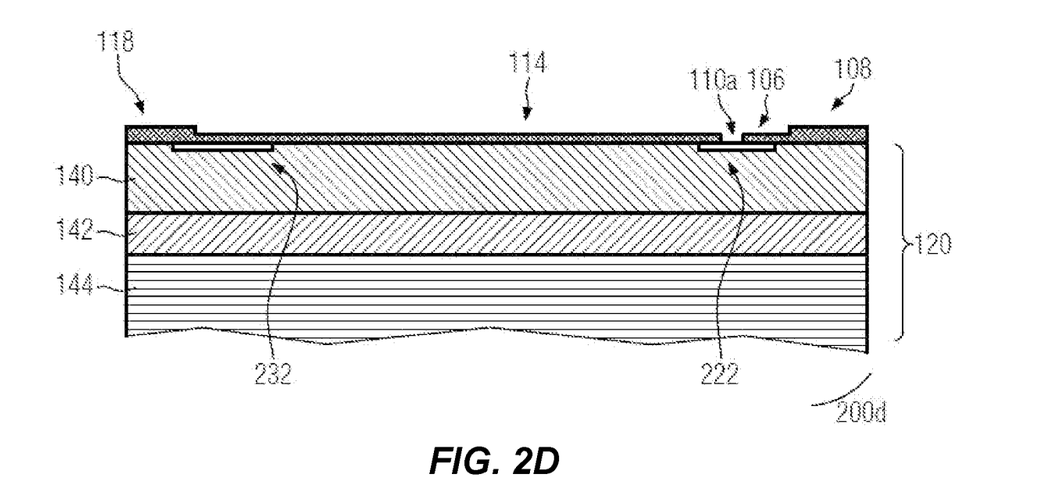
FIG. 2D represents a side view of a transducer structure according to another variant of the first embodiment of the present disclosure.

FIG. 2D represents a side view of a transducer structure 200d according to a fourth variant of the present disclosure.

Unlike the first three variants, while the first transverse mode suppression layer 222 extends partially under the bus bar 118, the second transverse mode suppression layer 232 does not extend under its corresponding bus bar 108 at all. Again, the locally modified regions 222 and 232 are not the same here.

FIGS. 3A to 3F illustrate further variants of the transverse mode suppression layers in a top view of the transducer structure. They all show different geometrical shapes of the transverse mode suppression layer.

Figure 3A:
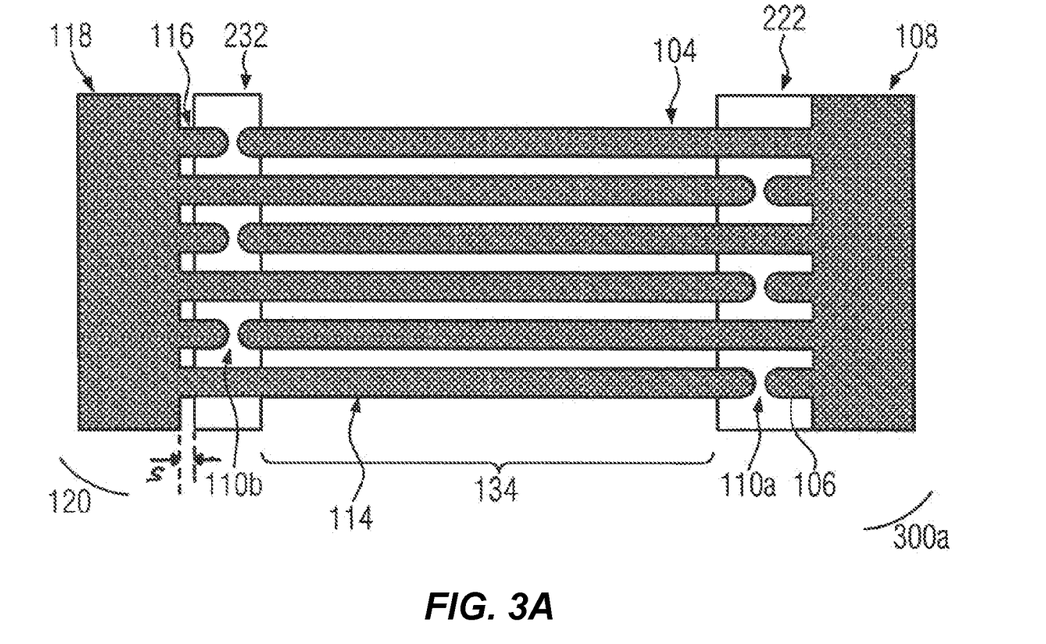
FIG. 3A represents a top view of a transducer structure according to a variant of the first embodiment of the present disclosure.

FIG. 3A represents a top view of a transducer structure according to a fifth variant of the first embodiment of the present disclosure. Compared to the embodiment shown in FIG. 1A, here the transverse mode suppression layer 222 extends at least until the bus bar 108 on one side and eventually even under the bus bar 108, while on the other side, the transverse mode suppression layer 232 is located at a distance s from the bus bar 118, like in the first embodiment. As a result, the transverse mode suppression layers 222 and 232 are different in dimensions and not symmetrical.

Figure 3B:
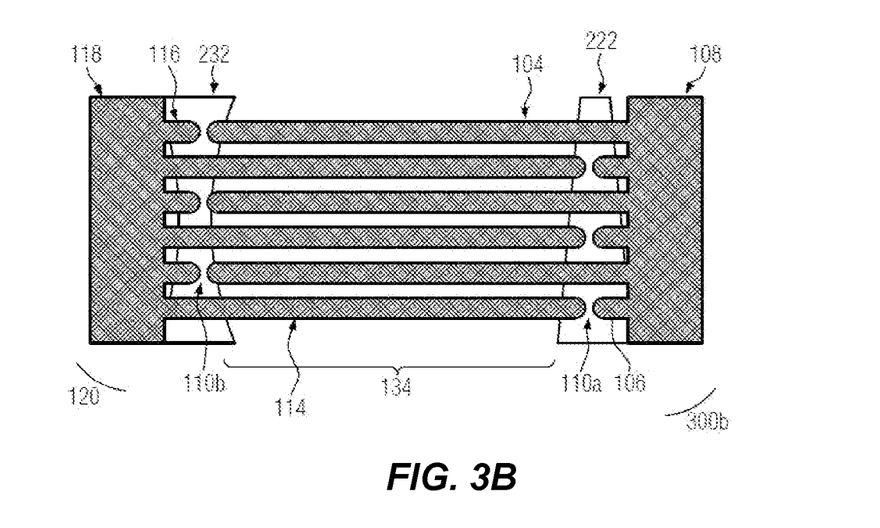
FIG. 3B represents a top view of a transducer structure according to another variant of the first embodiment of the present disclosure.

In FIG. 3B, a sixth variant is shown wherein the transverse mode suppression layers 222 and 232 are tapered.

Figure 3C:
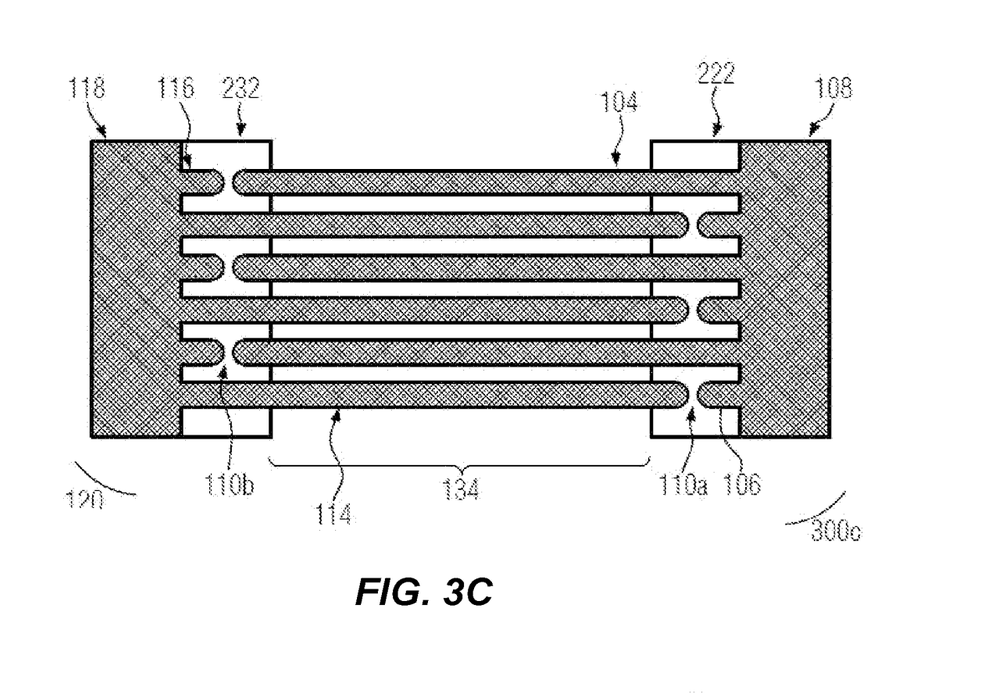
FIG. 3C represents a top view of a transducer structure according to another variant of the first embodiment of the present disclosure.

FIG. 3C represents the top view of a transducer structure, in particular, according to the second variant shown in FIG. 2B, where both transverse mode suppression layers 222, 232 extend under the bus bars 208, 218 and are symmetrical in shape and dimensions.

Figure 3D:
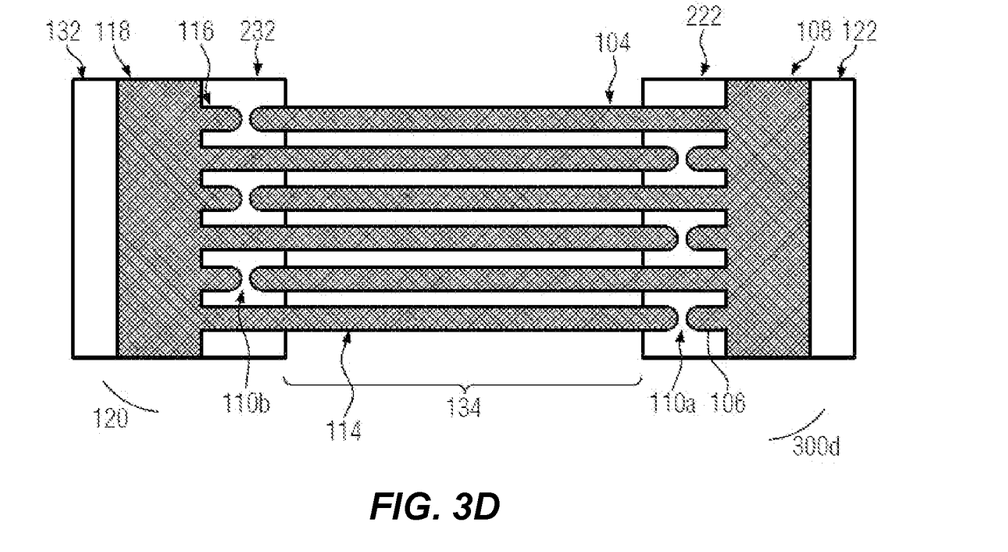
FIG. 3D represents a top view of a transducer structure according to another variant of the first embodiment of the present disclosure.

In the seventh variant, illustrated in FIG. 3D, compared to the variant shown in FIG. 3C, both transverse mode suppression layers 222, 232 extend even further outward than the bus bars 208, 218 in the X direction. In a variant, only one of the transverse mode suppression layers 222, 232 extends further outward than the bus bars 208, 218.

Figure 3E:
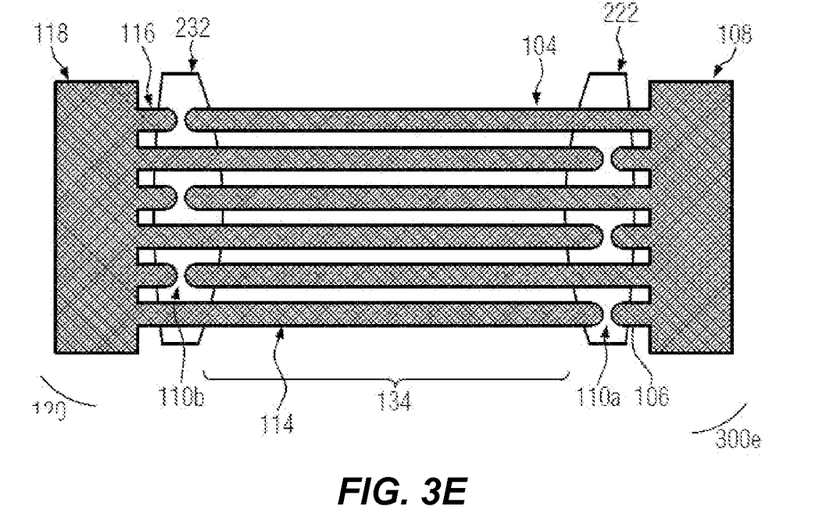
FIG. 3E represents a top view of a transducer structure according to another variant of the first embodiment of the present disclosure.

In the eighth variant illustrated in FIG. 3E, compared to the embodiment shown in FIG. 1A, the transverse mode suppression layers 222, 232 have a convex or concave shape to improve the mode confinement as less energy is radiated at the edge of the inter-digitated transducer.

Figure 3F:
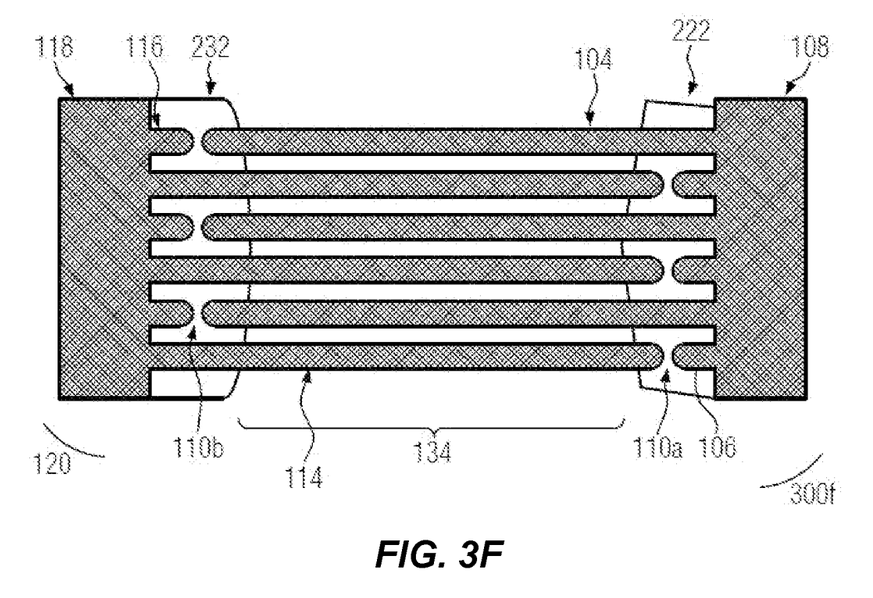
FIG. 3F represents a top view of a transducer structure according to another variant of the first embodiment of the present disclosure.

In the ninth variant, as shown in FIG. 3F, different shapes can be used for the transverse mode suppression layers 222, 232. In FIG. 3F, the shape of the second transverse mode suppression layer 232 is rounded while the shape of the first transverse mode suppression layer 222 is sharp. The rounded shape of the transverse mode suppression layers 232 is rounded with angles at different values to break any possible synchronism effect. This is also the case for sharp patterns, the angles are chosen in such a way no coherence should arise from one electrode edge to another.

Figure 4:
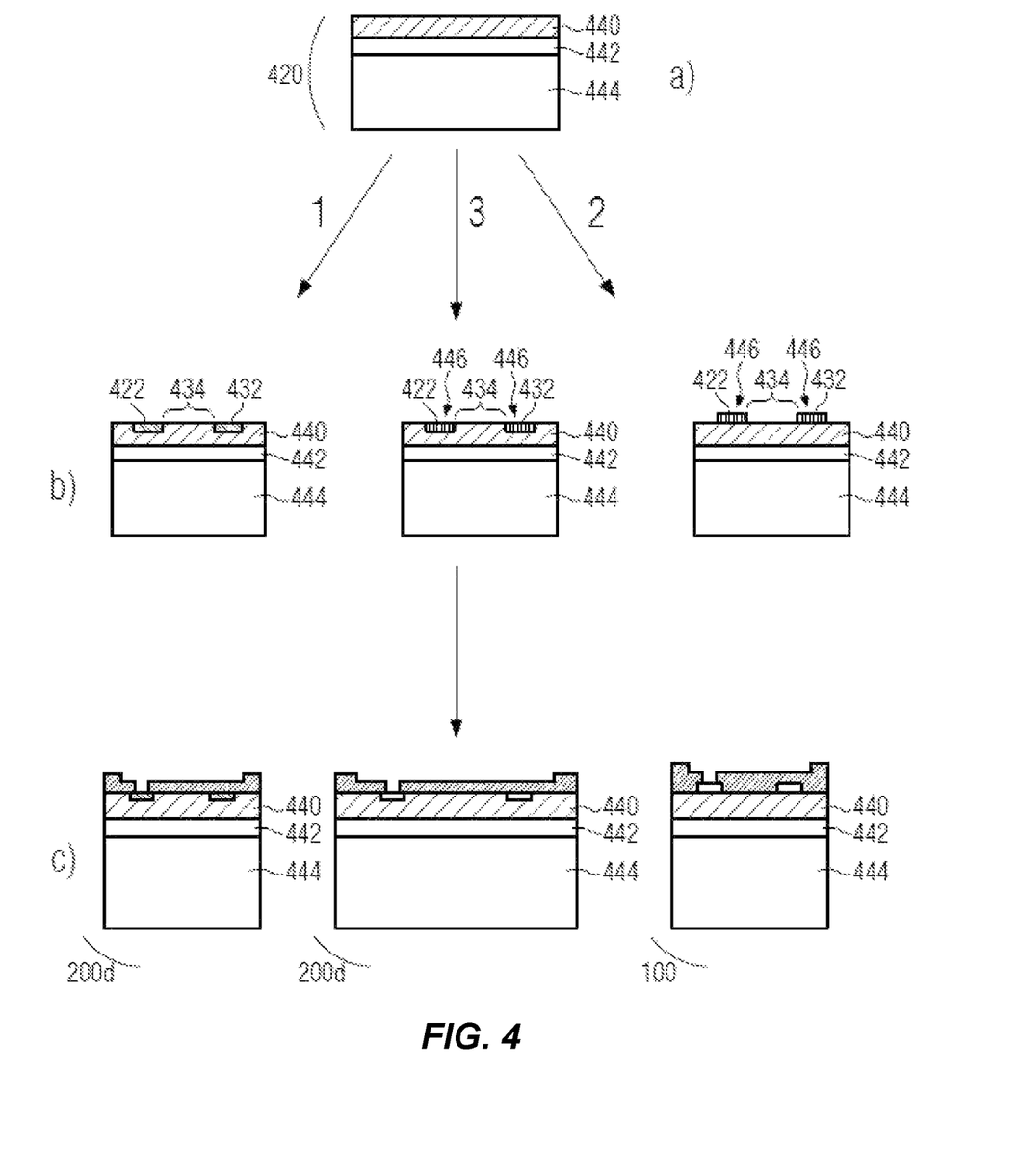
FIG. 4 represents a schematic diagram of a method for manufacturing a transducer structure according to the first embodiment of the present disclosure and its variants.

FIG. 4 represents a schematic of the steps of the method for manufacturing a transducer structure according to the first embodiment of the present disclosure and any of their variants.

According to step a), a piezoelectric substrate 420 is provided. In FIG. 4, the piezoelectric substrate 420 is a composite substrate, comprising a piezoelectric layer 440 over a base substrate 444. In this embodiment, a thin $SiO_2$ layer 442 is also present between the base substrate 444 and the piezoelectric layer 440. The piezoelectric substrate 420 is the same as the piezoelectric substrate 120 described in the first embodiment.

According to a first variant 1), two transverse mode suppression layers 422 and 432 are provided by doping the piezoelectric layer 440 with a different dose compared to the rest of the piezoelectric substrate in at least one region of the piezoelectric substrate.

This step comprises an implantation or diffusion of atomic species, in particular, Ti, in order to modify the concentration of the atomic species in the piezoelectric substrate of the transverse mode suppression layer.

According to a further variant, the step of providing the transverse mode suppression layer can be a proton exchange process.

The proton exchange process comprises a basic proton exchange from an organic proton source and an annealing post processing, which involves solely heating of the sample to redistribute the Lithium and Hydrogen ions.

The proton exchange technique is described in Chung et al, "Proton-Exchanged 36° Y-X $LiTaO_3$ Waveguides for Surface Acoustic Wave," IEEE transactions on UFFC, vol. 53, no. 2, 2006. The use of P-E enables to modify locally the piezoelectric layer. The proton exchange technique is an interesting technique for industrial approach to obtain the expected effect as it will not affect the surface roughness and therefore perfectly complies with planar technology processing as used in SAW industry.

According to a second variant 2) of the method, the step of providing the transverse mode suppression layer is a passivation layer deposition step. The deposited layer can be a dielectric passivation layer, more in particular, a $SiO_2$ layer.

The passivation layer 446 is deposited over the piezoelectric substrate 420, to from the first and second transverse mode suppression layers 422 and 432.

According to a third variant 3), the passivation layer can be at least partially embedded in the piezoelectric substrate 440. This variant comprises an etching step, in order to remove part of the piezoelectric substrate 440 in the regions 422, 432, or any other process that enables to reduce the thickness t of the piezoelectric substrate 440 in the regions 422, 432. The passivation then is deposited locally or all over the substrate and a chemical-mechanical polishing (CMP) step is applied to recover a perfectly plan surface conforming the SAW manufacturing usual requirement.

Afterwards, a pair of inter-digitated comb electrodes are formed on the piezoelectric substrate, using a combination of layer deposition and patterning steps, as shown in FIG. 4C.

Figure 5:
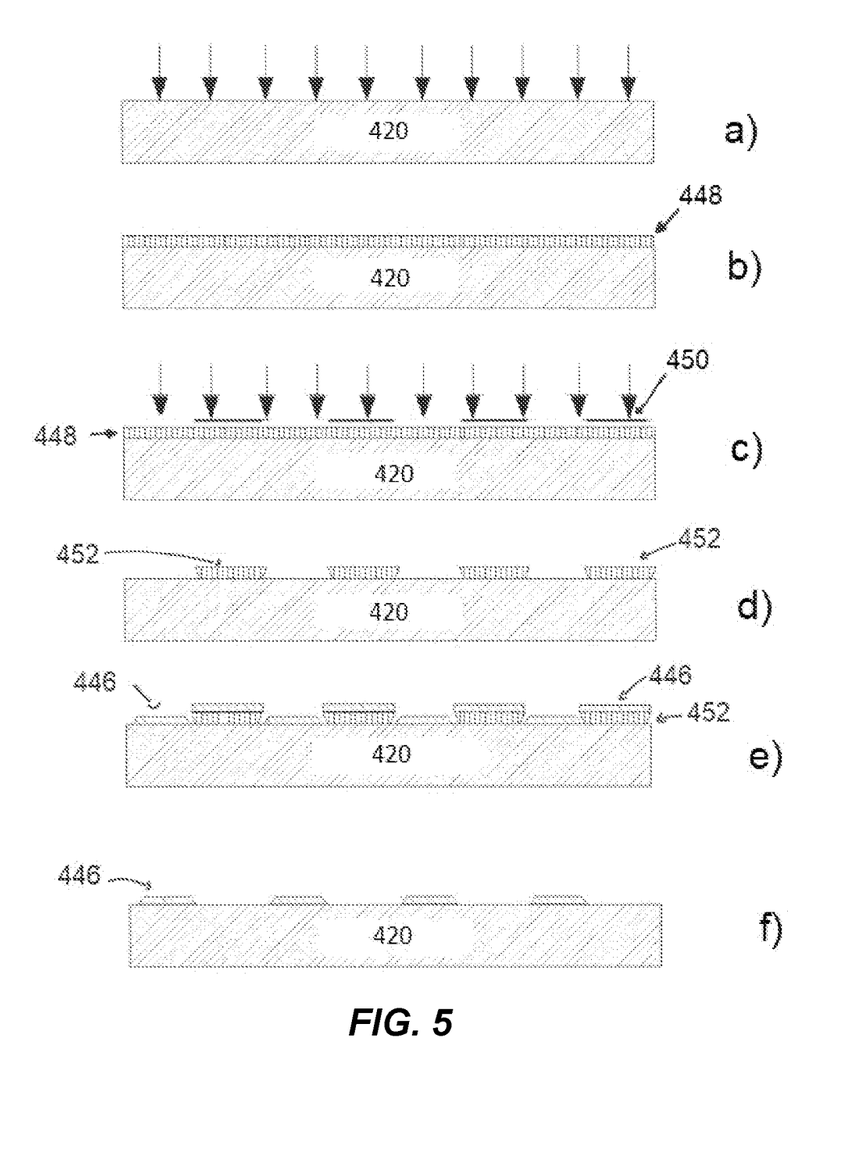
FIG. 5 represents a schematic diagram of a method for manufacturing a transducer structure according to the fourth variant of the first embodiment of the present disclosure.

According to a fourth variant of the present disclosure, as shown in FIG. 5, the passivation layer can be patterned by a lift off process, so that the sides of the passivation layer are inclined in such a way that the deposited comb electrodes cover these sides without rupture, providing a regular and continuous reduction of the phase velocity in the corresponding region. In that case, no etching is required, thus keeping the substrate in good condition. Alignment marks, however, must be deposited to prepare the surface according to the usual technology processes in that purpose.

As a first step a), the POI substrate 420 is cleaned with an $O_2$ plasma process. Then, a deposition of a photoresist film 448, in particular, by spin coating, is performed (step b)). A UV lithography step is performed through a UV mask 450 on the photoresist film 448 as step c) so as to obtain a patterned photoresist film with a plurality of structures 452 with slanted wall edges, in step d). In step e), the passivation layer 446 is deposited over the POI substrate 420 and over the patterned photoresist film 450, thus, also in between the structures 452 of the patterned photoresist film 450 to from the transverse mode suppression layers 422, 432. Due to the slanted wall edges of the structures 452 of the patterned photoresist film 450, the deposition of the passivation layer 446 over the POI substrates 420 results in the passivation layer 446 being deposited in between the structures 452 of the patterned photoresist film 448 and comprising also slanted wall edges, as shown in step e). Finally, a step f) is performed to remove the structures 452 of the patterned photoresist film 450 with the passivation layer 446 on top and only the passivation layer 446 present directly over the POI substrate 420 in between the structures 452 of the patterned photoresist film 450 are left on the surface of the POI substrate 420.

According to the method of the present disclosure, the inter-digitated electrodes are formed above the transverse mode suppression layer and the piezoelectric substrate. The transverse mode suppression layer is formed before the inter-digitated electrodes are formed. To the contrary of the state of the art devices, where the inter-digitated electrodes are formed on the piezoelectric substrate and subsequently a transverse mode suppression layer is formed over the inter-digitated electrodes.

According to a variant of the present disclosure, the inter-digitated comb electrodes are formed above the first and/or second transverse mode suppression layers and the piezoelectric substrate. The transverse mode suppression layers are thus formed before the inter-digitated comb electrodes are formed. To the contrary of the state of the art devices, where the inter-digitated electrodes are formed on the piezoelectric substrate and subsequently a transverse mode suppression layer is formed over the inter-digitated electrodes.

Various embodiments of the present disclosure have been described. Nevertheless, it is understood that various modifications and enhancements may be made without departing from the scope of the invention as defined by the following claims.

The invention claimed is:

1. A transducer structure, comprising:
   a piezoelectric substrate;
   at least a pair of inter-digitated comb electrodes on the piezoelectric substrate including a first comb electrode and a second comb electrode, wherein:
   the first comb electrode comprises a first bus bar and a plurality of electrode fingers alternating with shorter dummy electrode fingers, both extending from the first bus bar;
   the second comb electrode comprises a second bus bar and a plurality of electrode fingers extending from the second bus bar;
   the dummy electrode fingers of the first bus bar face the electrode fingers of the second bus bar and are separated from the electrode fingers by first gaps; and the second comb electrode further comprises shorter dummy electrode fingers alternating with the electrode fingers of the second comb electrode;

the dummy electrode fingers extending from the second bus bar face the electrode fingers extending from the first bus bar and are separated from the electrode fingers extending from the first bus bar by second gaps; and a first transverse mode suppression layer provided partially between the first gaps and the piezoelectric substrate, a phase velocity of a guided wave being smaller in the region of the transverse mode suppression layer compared to a phase velocity of the guided wave in a central region of the piezoelectric substrate underneath the alternating electrode fingers of the first and second comb electrodes; and a second transverse mode suppression layer extending at least partially between the second gaps and the piezoelectric substrate, a phase velocity of a guided wave being smaller in the region of the second transverse mode suppression layer compared to a phase velocity of the guided wave in the central region of the piezoelectric substrate underneath the alternating electrodes fingers of the first and second comb electrodes between the first and second transverse mode suppression layers, wherein the first transverse mode suppression layer and the second transverse mode suppression layer have different shapes and/or dimensions at least in a cross-section substantially parallel to the first and second comb electrodes and the piezoelectric substrate.

2. The transducer structure of claim 1, wherein the first transverse mode suppression layer extends under each of the first gaps.

3. The transducer structure of claim 1, wherein the second transverse mode suppression layer extends between all the second gaps and the piezoelectric substrate.

4. The transducer structure of claim 1, wherein the first transverse mode suppression layer extends at least partially up to the first bus bar and/or the second transverse mode suppression layer extends at least partially up to the second bus bar.

5. The transducer structure of claim 1, wherein the first transverse mode suppression layer further extends at least partially or totally between the first bus bar and the piezoelectric substrate and/or the second transverse mode suppression layer extends at least partially or totally between the second bus bar and the piezoelectric substrate.

6. The transducer structure of claim 1, wherein the first and/or second transverse mode suppression layer comprises a different doping dose compared to a doping dose of a remainder of the piezoelectric substrate in the central region of the piezoelectric substrate underneath the inter-digitated comb electrodes for modulating the phase velocity of the guided wave of the transducer structure.

7. The transducer structure of claim 6, wherein the different doping dose is a dose of titanium.

8. The transducer structure of claim 1, wherein the first transverse mode suppression layer and/or second transverse mode suppression layer comprises a passivation layer.

9. The transducer structure of claim 8, wherein the passivation layer is at least partially embedded in the piezoelectric substrate.

10. The transducer structure of claim 1, wherein the first and second transverse mode suppression layers are mirror symmetrical with respect to a center line of the inter-digitated comb electrodes that is substantially equidistant from the bus bars in a cross-section substantially parallel to the piezoelectric substrate.

11. The transducer structure of claim 1, wherein the piezoelectric substrate is a composite substrate comprising a piezoelectric layer on a base substrate, wherein the piezoelectric layer has a thickness in the layered direction less than an operating wavelength of the transducer structure.

12. The transducer structure of claim 1, wherein a thickness of the first transverse mode suppression layer in a direction perpendicular to the piezoelectric substrate and/or a thickness of the second transverse mode suppression layer in the direction perpendicular to the piezoelectric substrate is greater than $1/20$ of an operating wavelength of the transducer structure, while being inferior to a thickness of the piezoelectric layer in the direction perpendicular to the first and second transverse mode suppression layers.

13. The transducer structure of claim 12, wherein the thickness of the first transverse mode suppression layer and/or a thickness of the second transverse mode suppression layer is less than half of the operating wavelength of the transducer structure.

14. The transducer structure of claim 1, wherein the thickness of the suppression layer in the direction perpendicular to the piezoelectric substrate is ±50% of a thickness of the pair of inter-digitated comb electrodes, and wherein the inter-digitated comb electrodes comprise an alloy including aluminum and copper and having between 0.5% and 2% copper, and wherein the thickness of the inter-digitated comb electrodes in the direction perpendicular to the piezoelectric substrate is between 5% and 20% of an operating wavelength of the transducer structure.

15. The transducer structure of claim 1, wherein the guided waves comprise elliptical polarization waves, shear waves, pure or almost pure longitudinal compression waves, and wherein the guided waves exhibit electromechanical coupling superior to 7%.

16. A surface acoustic wave device comprising a transducer structure according to claim 1.

17. A method of manufacturing a transducer structure comprising the steps of:

a) providing a piezoelectric substrate; and b) forming at least a pair of inter-digitated comb electrodes over the piezoelectric substrate including a first comb electrode and a second comb electrode, wherein the first comb electrode comprises a first bus bar and a plurality of alternating electrode fingers and shorter dummy electrode fingers, both extending from the first bus bar, the second comb electrode comprises a second bus bar and a plurality of alternating electrode fingers extending from the second bus bar, the dummy electrodes of the first bus bar face the electrode fingers of the second bus bar and are separated from the electrode fingers by first gaps, and wherein the second comb electrode further comprises shorter dummy electrode fingers alternating with the electrode fingers, and the dummy electrode fingers of the second bus bar face the electrode fingers of the first bus bar and are separated from the electrode fingers of the first bus bar by second gaps; and a step c) prior to step b) of providing a first and a second transverse mode suppression layer such that after step b) the first transverse mode suppression layer is partially between the first gap and the piezoelectric substrate, and the second transverse mode suppression layer extends at least partially between the second gaps and the piezoelectric substrate, wherein the first transverse mode suppression layer and the second transverse mode suppression layer are chosen such that a phase velocity of a guided wave is smaller in the regions of the first transverse mode suppression layer and the second transverse mode suppression layer compared to a phase velocity of the guided wave in the piezoelectric substrate in a central region of the piezoelectric substrate between the first and second transverse mode suppression layers, and wherein the first transverse mode suppression layer and the second transverse mode suppression layer have different shapes and/or dimensions at least in a cross-section substantially parallel to the first and second comb electrodes and the piezoelectric substrate.

18. The method of claim 17, wherein the step c) of providing the first and the second transverse mode suppression layer comprises a step of modifying a doping dose of the piezoelectric substrate for modulating the phase velocity of the guided wave of the transducer structure.

19. The method of claim 17, wherein the step c) of providing the first and the second transverse mode suppression layer comprises providing a passivation layer.

20. The method of claim 19, further comprising patterning the passivation layer by a lift-off process such that sides of edge walls of the passivation layer are inclined.

* * * * *